US008587086B2

(12) United States Patent
Cheng et al.

(10) Patent No.: US 8,587,086 B2
(45) Date of Patent: Nov. 19, 2013

(54) SELF-ALIGNED DUAL DEPTH ISOLATION AND METHOD OF FABRICATION

(75) Inventors: Kangguo Cheng, Guiderland, NY (US); Robert Heath Dennard, Croton-on-Hudson, NY (US); Bruce B. Doris, Brewster, NY (US); Ali Khakifirooz, Slingerlands, NY (US); Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/598,992

(22) Filed: Aug. 30, 2012

(65) Prior Publication Data

US 2012/0319232 A1     Dec. 20, 2012

Related U.S. Application Data

(62) Division of application No. 13/070,568, filed on Mar. 24, 2011, now Pat. No. 8,293,615.

(51) Int. Cl.
  *H01L 21/70*    (2006.01)
(52) U.S. Cl.
  USPC ..................................... 257/510; 257/E29.02
(58) Field of Classification Search
  USPC .............................. 257/506, 507, E29.02, 510
  See application file for complete search history.

(56) References Cited

U.S. PATENT DOCUMENTS

| | | | | |
|---|---|---|---|---|
| 7,476,933 | B2 * | 1/2009 | Juengling | ..................... 257/331 |
| 2005/0090066 | A1 | 4/2005 | Zhu et al. | |
| 2007/0246795 | A1 | 10/2007 | Fang et al. | |
| 2008/0164558 | A1 | 7/2008 | Yang et al. | |
| 2009/0003105 | A1 * | 1/2009 | Itoh et al. | ..................... 365/203 |
| 2009/0267156 | A1 | 10/2009 | Anderson et al. | |
| 2009/0269897 | A1 | 10/2009 | Anderson et al. | |
| 2010/0006985 | A1 * | 1/2010 | Desouza et al. | ............. 257/647 |
| 2010/0176482 | A1 | 7/2010 | Dennard et al. | |

* cited by examiner

*Primary Examiner* — William D Coleman
*Assistant Examiner* — Christine Enad
(74) *Attorney, Agent, or Firm* — Louis J. Percello; Michael J. Chang, LLC

(57) ABSTRACT

FDSOI devices and methods for the fabrication thereof are provided. In one aspect, a method for fabricating a device includes the following steps. A wafer is provided having a substrate, a BOX and a SOI layer. A hardmask layer is deposited over the SOI layer. A photoresist layer is deposited over the hardmask layer and patterned into groups of segments. A tilted implant is performed to damage all but those portions of the hardmask layer covered or shadowed by the segments. Portions of the hardmask layer damaged by the implant are removed. A first etch is performed through the hardmask layer to form a deep trench in the SOI layer, the BOX and at least a portion of the substrate. The hardmask layer is patterned using the patterned photoresist layer. A second etch is performed through the hardmask layer to form shallow trenches in the SOI layer.

9 Claims, 9 Drawing Sheets

FIG. 34
DD'

SELF-ALIGNED DUAL DEPTH ISOLATION AND METHOD OF FABRICATION

CROSS-REFERENCE TO RELATED APPLICATIONS

This application is a divisional of U.S. application Ser. No. 13/070,568 filed on Mar. 24, 2011, now U.S. Pat. No. 8,293,615, the contents of which are incorporated by reference herein.

FIELD OF THE INVENTION

The present invention relates to planar fully depleted silicon-on-insulator (FDSOI) devices and more particularly, to planar FDSOI devices with back gate biasing and methods for the fabrication thereof that employ single mask, self-aligned dual depth isolation techniques.

BACKGROUND OF THE INVENTION

Back gate biasing is a powerful method for adaptive power management. Planar fully depleted silicon-on-insulator (FDSOI) devices with thin buried oxide (BOX) are especially of interest because they provide significant body factor without compromising device performance. Body factor ($\gamma$) is a ratio of the shift in the threshold voltage (Vt) to the change in the back gate bias (BG), i.e., $\gamma = \Delta Vt/\Delta V\_BG$. For back gate biasing to be area efficient, a group of transistors with the same polarity and target threshold voltage should share a single back gate. However, the back gate should be separated (isolated) from adjacent transistors that have a different polarity or need a different back bias.

The conventional method to address shared versus isolated back gates is to use deep trench isolation and rely on triple-well (junction) isolation. This way, adjacent devices with the same back gate polarity (for example n-well) share the same back gate while adjacent devices with different well polarity are isolated. This method, however, is not well-suited for future technology nodes because it 1) requires deep isolation which complicates the process and limits device packing, 2) junction isolation has a lower limit on well-to-well junction leakage especially when bias is applied, and 3) well polarity is dictated by the isolation needs (adjacent devices that require different bias cannot have the same well polarity). With regard to the second point, a given well doping is needed to meet well resistance targets, thus well-to-well junction leakage cannot be lowered below a certain limit. This also limits the options for well bias, i.e., no forward biased p-n junction is allowed.

To remove these restrictions from back gate designs, a dual depth isolation is needed. In this approach, devices that share the same back gate are isolated by a shallow trench that extends only through a top channel layer but does not penetrate through the BOX, whereas devices that have different back gate polarity are isolated by a deeper trench. With a double-BOX structure, dual depth isolation is the only option.

There are two ways to obtain dual depth isolation. The first approach is to use two different masks to define the two (deep and shallow) isolation regions. As such, the deep and shallow trenches will not be self-aligned. This approach also creates non-uniform depth at the intercepts of the shallow and deep trenches. Therefore, the application of this first approach for dense arrays like static random access memory (SRAM) is very challenging. The second approach is to use integration schemes to produce different depth trenches with a single mask. The most common approach is to rely on the trench opening to obtain trenches with different depth (e.g., by using loading effects in reactive ion etching (RIE) processes, wherein trenches that have a wider opening are etched deeper than trenches that are narrower). The main disadvantage of this approach is the area penalty. For example, with an SRAM array with 40 nanometer (nm) ground role (GR)-limited spacing between adjacent transistors, spacing of about 80 nm is needed between n-channel field effect transistors (NFETs) and p-channel field effect transistors (PFETs) to ensure reasonable difference in trench depth.

Therefore, dual depth isolation techniques that solve the above-described problems would be desirable.

SUMMARY OF THE INVENTION

The present invention provides planar fully depleted silicon-on-insulator (FDSOI) devices and methods for the fabrication thereof. In one aspect of the invention, a method for fabricating a device is provided. The method includes the following steps. A wafer is provided having a substrate, a buried oxide (BOX) over the substrate and a semiconductor-on-insulator (SOI) layer over the BOX. A hardmask layer is deposited over the SOI layer. A photoresist layer is deposited over the hardmask layer. The photoresist layer is patterned into groups of segments, wherein the segments in each of the groups are spaced apart from one another in a first direction and wherein the groups are spaced apart from one another in a second direction, and wherein the first direction and the second direction are perpendicular to one another. A tilted implant is performed along the first direction to damage all but those portions of the hardmask layer covered or shadowed by the photoresist layer segments. The hardmask layer is patterned along the first direction by removing portions of the hardmask layer damaged by the implant. A first etch is performed through the hardmask layer to form a deep trench in the SOI layer, the BOX and at least a portion of the substrate along the first direction, wherein the deep trench comprises a deep isolation region of the device. The hardmask layer is patterned along the second direction using the patterned photoresist layer. A second etch is performed through the hardmask layer to form shallow trenches in the SOI layer along the second direction, wherein the shallow trenches comprise shallow isolation regions of the device, and wherein the deep isolation region and the shallow isolation regions formed in this manner are self-aligned to one another.

In another aspect of the invention, another method for fabricating a device is provided. The method includes the following steps. A wafer is provided having a first semiconductor layer, a first BOX under the first semiconductor layer, a second semiconductor layer under the first BOX, a second BOX under the second semiconductor layer and a substrate under the second BOX. A hardmask layer is deposited over the first semiconductor layer. A photoresist layer is deposited over the hardmask layer. The photoresist layer is patterned into groups of segments, wherein the segments in each of the groups are spaced apart from one another in a first direction and wherein the groups are spaced apart from one another in a second direction, and wherein the first direction and the second direction are perpendicular to one another. A tilted implant is performed along the first direction to damage all but those portions of the hardmask layer covered or shadowed by the photoresist layer segments. The hardmask layer is patterned along the first direction by removing portions of the hardmask layer damaged by the implant. A first etch is performed through the hardmask layer to form a deep trench in the first semiconductor layer, the first BOX and the second semiconductor layer along the first direction, wherein the deep trench comprises a deep isolation region of the device. The hardmask layer is patterned along the second direction using the patterned photoresist layer. A second etch is performed through the hardmask layer to form shallow trenches in the first semiconductor layer along the second direction, wherein the shallow trenches comprise shallow isolation regions of the device, and wherein the deep isolation region and the shallow isolation regions formed in this manner are self-aligned to one another.

In yet another aspect of the invention, a device is provided. The device includes a deep isolation region formed in a wafer along a first direction and shallow isolation regions self-aligned to the deep isolation region formed in the wafer along a second direction, wherein the first direction and the second direction are perpendicular to one another; and a dielectric material filling the deep isolation region and the shallow isolation regions.

A more complete understanding of the present invention, as well as further features and advantages of the present invention, will be obtained by reference to the following detailed description and drawings.

DETAILED DESCRIPTION OF PREFERRED EMBODIMENTS

Provided herein are planar fully depleted silicon-on-insulator (FDSOI) devices and techniques for the fabrication thereof that employ a self-aligned dual depth process that uses a single mask to define the active region and the back gate. FIGS. 1-4 are diagrams illustrating an exemplary planar FDSOI device 100 fabricated using the present techniques.

Figure 1:
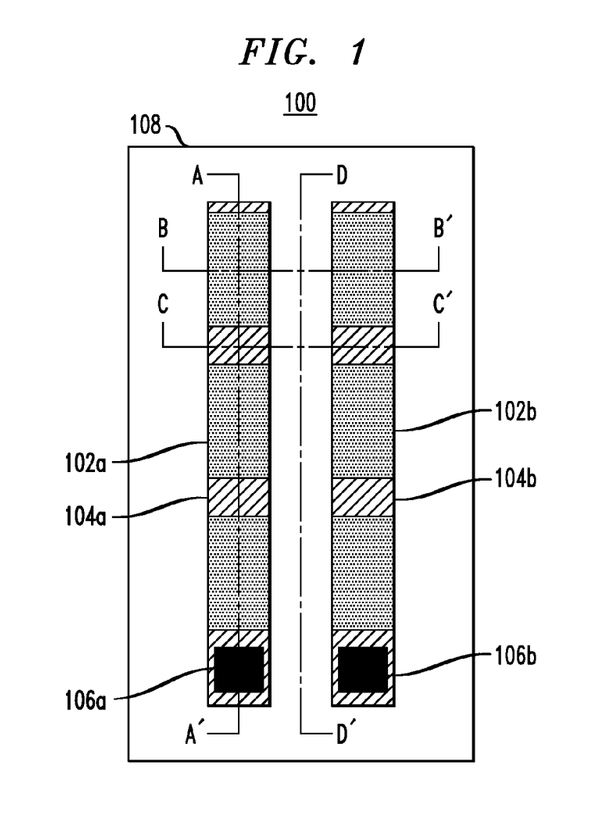
FIG. 1 is a top-down diagram of a single-buried oxide (BOX) planar fully depleted silicon-on-insulator (FDSOI) device according to an embodiment of the present invention.

Specifically, FIG. 1 is a top-down diagram of planar FDSOI device 100. As shown in FIG. 1, device 100 includes a plurality of active areas 102a and 102b. Each active area contains at least one transistor. The transistors in active areas 102a share the same back gate 104a. The transistors in active areas 102a can have the same or different gate polarity as one another. Similarly, the transistors in active areas 102b share the same back gate 104b. The transistors in active areas 102b can have the same or different gate polarity as one another. The active areas 102a are separated from one another by shallow isolation regions (see for example FIG. 2, described below). Similarly, the active areas 102b are also separated from one another by shallow isolation regions.

Figure 5:
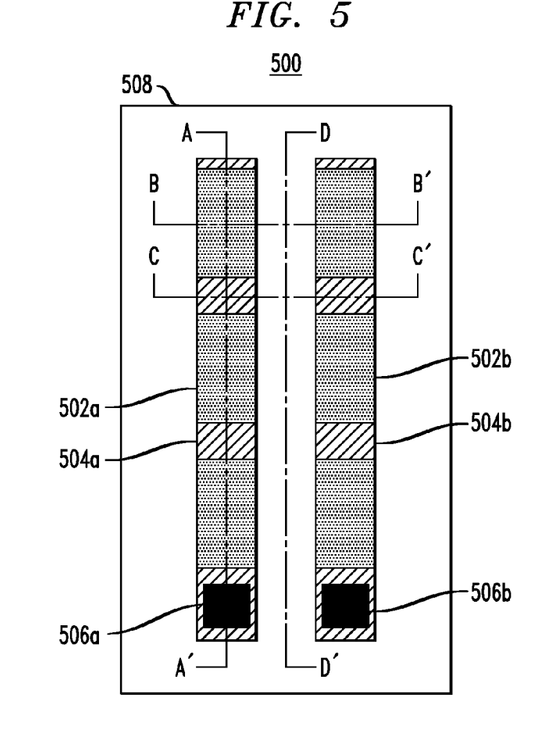
FIG. 5 is a top-down diagram of a double-BOX planar FDSOI device according to an embodiment of the present invention.

To aid in the following description, reference will be made to vertical and horizontal dimensions of the device based on the orientation of the device as shown in FIG. 1 and FIG. 5 (described below). For example, as shown in FIG. 1, active areas 102a are aligned along a vertical direction of the device, such that a cut through line AA' is a cut along the vertical direction of the device. See for example FIG. 2 (described below). Further, active areas 102a are spaced apart from one another in the vertical direction, i.e., by shallow isolation regions, see below. The same is true for active areas 102b. Similarly, as shown in FIG. 1, back gates 104a and 104b are spaced apart from one another in a horizontal direction of the device, i.e., by a deep isolation region, see below. Therefore a cut through line BB' for example is a cut along the horizontal direction of the device. The terms "vertical" and "horizontal" are being used herein merely to describe the exemplary orientation shown in FIGS. 1 and 5, and should not be used to limit the present techniques to devices having a particular vertical/horizontal configuration. Thus, in general terms "vertical" and "horizontal" merely represent a "first direction" and a "second direction," respectively, wherein the first direction and the second direction are, e.g., perpendicular to one another.

A contact 106a is provided to back gate 104a, and a contact 106b is provided to back gate 104b. As will be described in detail below, device 100 is formed in a silicon-on-insulator (SOI) wafer having a SOI layer (which will serve as channels of the device) and a buried oxide (BOX) separating the SOI layer from a substrate 108. The use of an SOI wafer with the SOI layer as the channels of the device allows for a fully depleted device configuration, wherein the channels are depleted of charge when the device is not in use.

The transistors in active areas 102a have a different back gate from the transistors in active areas 102b, and thus are separated from one another by a deep isolation region that isolates back gate 104a from back gate 104b. See, for example, FIG. 3, described below.

An insulator material, e.g., the BOX plus an additional oxide fill, which is present between the active areas and between the active areas and the back gates (see, for example, FIGS. 2-4, described below) is not shown in the depiction of FIG. 1 to illustrate an important aspect of the present self-aligned fabrication techniques, namely, that the back gates are formed only in the active areas, i.e., the back gates are self-aligned to the active areas. This is a result of the present fabrication process, described in detail below, that uses a single mask to define the active areas and the back gate. The use of a single mask process avoids the problems highlighted above that are associated with using two separate masks for the shallow and deep isolation.

Figure 2:
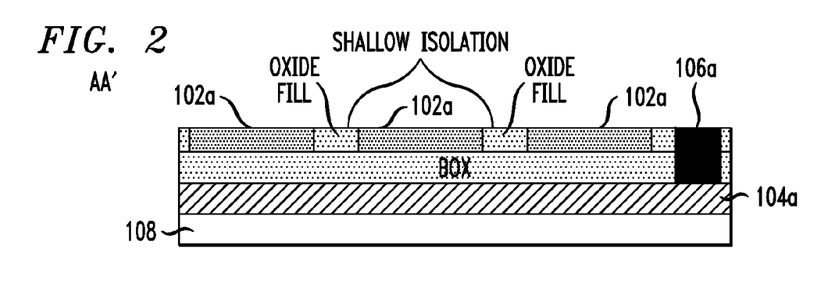
FIGS. 2-4 are cross-sectional diagrams illustrating various cuts taken through the device of FIG. 1 according to an embodiment of the present invention.

FIG. 2 is a cross-sectional diagram illustrating a cut through line AA' of FIG. 1. As shown in FIG. 2, shallow isolation regions are present between the active areas 102a. An insulator material, e.g., the BOX plus an additional oxide fill, is present between the active areas 102a and between the active areas 102a and the back gate 104a. The same configuration would be present with regard to active areas 102b.

Figure 3:
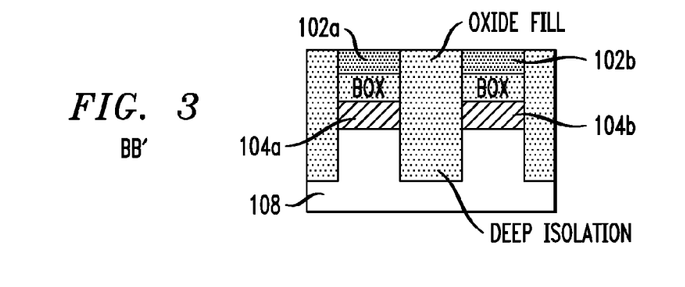
Figure 4:
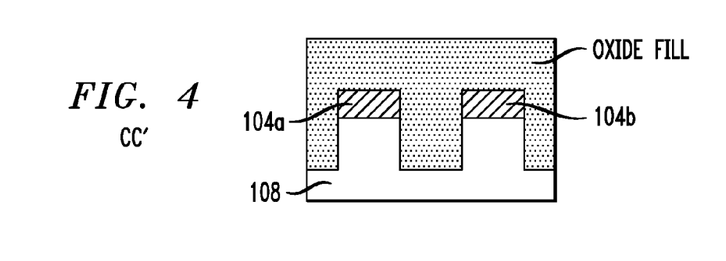

FIG. 3 is a cross-sectional diagram illustrating a cut through line BB' of FIG. 1. As shown in FIG. 3, the deep isolation region separates back gate 104a from back gate 104b. FIG. 4 is a cross-sectional diagram illustrating a cut through line CC' of FIG. 1.

As will be described in detail below, a single mask is used to pattern the deep isolation region and the shallow isolation regions. Thus, these regions will, in the completed device, be self-aligned to one another.

The present techniques may also be used to fabricate a planar FDSOI device in a double-BOX structure. This configuration is shown in FIGS. 5-8. Specifically, FIG. 5 is a top-down diagram of planar FDSOI device 500. In contrast to planar FDSOI device 100 described in conjunction with the description of FIGS. 1-4, above, planar FDSOI device 500 is formed in a double-BOX SOI wafer. As shown in FIG. 5, device 500 includes a plurality of active areas 502a and 502b. Each active area contains at least one transistor. The transistors in active areas 502a share the same back gate 504a. The transistors in active areas 502a can have the same or different gate polarity as one another. Similarly, the transistors in active areas 502b share the same back gate 504b. The transistors in active areas 502b can have the same or different gate polarity as one another. The active areas 502a are separated from one another by shallow isolation regions (see for example FIG. 6, described below). Similarly, the active areas 502b are also separated from one another by shallow isolation regions.

As highlighted above, to aid in the following description, reference will be made to vertical and horizontal dimensions of the device based on the orientation of the device as shown in FIG. 1 and FIG. 5. For example, as shown in FIG. 5, active areas 502a are aligned along a vertical direction of the device, such that a cut through line AA' is a cut along the vertical direction of the device. See for example FIG. 6 (described below). Further, active areas 502a are spaced apart from one another in the vertical direction, i.e., by shallow isolation regions, see below. The same is true for active areas 502b. Similarly, as shown in FIG. 5, back gates 504a and 504b are spaced apart from one another in a horizontal direction of the device, i.e., by a deep isolation region, see below. Therefore a cut through line BB' for example is a cut along the horizontal direction of the device. The terms "vertical" and "horizontal" are being used herein merely to describe the exemplary orientation shown in FIGS. 1 and 5, and should not be used to limit the present techniques to devices having a particular vertical/horizontal configuration. Thus, in general terms "vertical" and "horizontal" merely represent a "first direction" and a "second direction," respectively, wherein the first direction and the second direction are, e.g., perpendicular to one another.

A contact 506a is provided to back gate 504a, and a contact 506b is provided to back gate 504b. Device 500 is formed in a SOI wafer having two semiconductor, e.g., silicon (Si), layers separated from one another by a BOX and a second BOX separating the semiconductor, e.g., Si, layers from a substrate 508. As highlighted above, the use of an SOI wafer with the SOI layer (in this case, the top semiconductor, e.g., Si, layer) as the channels of the device allows for a fully depleted device configuration, wherein the channels are depleted of charge when the device is not in use.

The transistors in active areas 502a have a different back gate from the transistors in active areas 502b, and thus are separated from one another by a deep isolation region that isolates back gate 504a from back gate 504b. See, for example, FIG. 7, described below.

An insulator material, e.g., the dual-BOX layers plus an additional oxide fill, which is present between the active areas, between the active areas and the back gates and between the back gates and the substrate (see, for example, FIGS. 6-8, described below) are not shown in the depiction of FIG. 5 to illustrate an important aspect of the present self-aligned fabrication techniques, namely that the back gates are formed only in the active areas, i.e., the back gates are self-aligned to the active areas. Again, this is a result of the present fabrication process wherein a single mask is used to define the active areas and the back gate.

Figure 6:
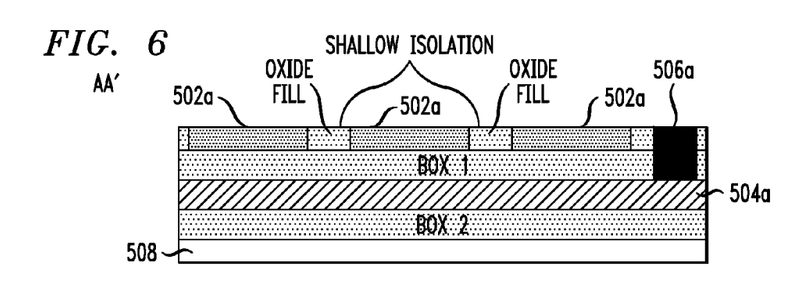
FIGS. 6-8 are cross-sectional diagrams illustrating various cuts taken through the device of FIG. 5 according to an embodiment of the present invention.

FIG. 6 is a cross-sectional diagram illustrating a cut through line AA' of FIG. 5. As shown in FIG. 6, shallow isolation regions are present between the active regions 502a. An insulator material, e.g., the first of two BOX layers (BOX 1) plus an additional oxide fill, is present between the active areas 502a and between the active areas 502a and the back gate 504a. An insulator material, e.g., the second BOX layer (BOX 2), is present between the back gate 504a and the substrate 508. The same configuration would be present with regard to active regions 502b.

Figure 7:
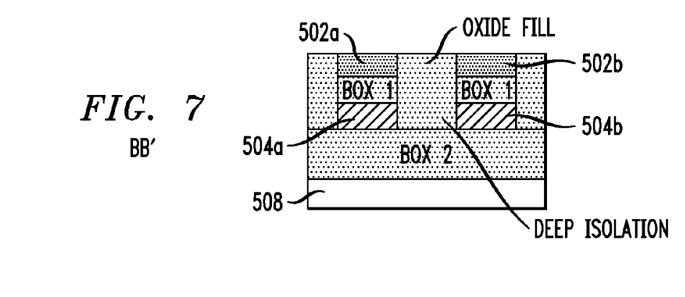
Figure 8:
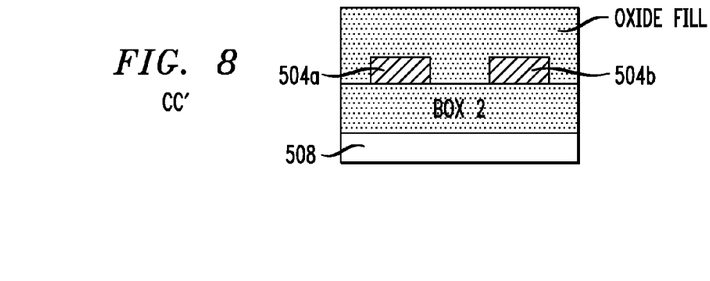

FIG. 7 is a cross-sectional diagram illustrating a cut through line BB' of FIG. 5. As shown in FIG. 7, the deep isolation region separates back gate 504a from back gate 504b. FIG. 8 is a cross-sectional diagram illustrating a cut through line CC' of FIG. 5.

As will be described in detail below, a single mask is used to pattern the deep isolation region and the shallow isolation regions. Thus, these regions will, in the completed device, be self-aligned to one another.

An exemplary single-mask process for fabricating the single-BOX planar FDSOI devices of FIGS. 1-4 will now be described with reference to FIGS. 9-21. The double-BOX configuration of FIGS. 5-8 will be addressed in FIGS. 22-34, described below.

Figure 9:
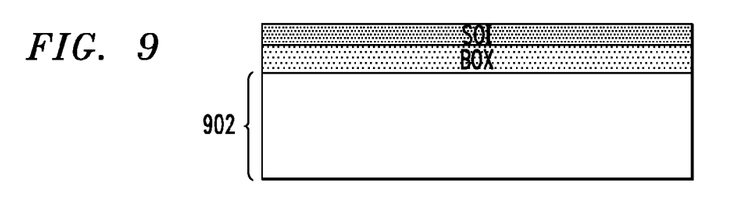
FIGS. 9-21 are diagrams illustrating an exemplary methodology for fabricating a single-BOX planar FDSOI device, such as the device of FIGS. 1-4, according to an embodiment of the present invention.

FIG. 9 is a cross-sectional diagram illustrating a starting structure for the fabrication process. Namely, a SOI wafer is provided having a SOI layer and a BOX separating the SOI layer from a substrate 902 (e.g., a silicon substrate). The BOX is preferably thin, i.e., having a thickness of from about 2 nanometers (nm) to about 50 nm, so as to get a large body factor.

Figure 10:
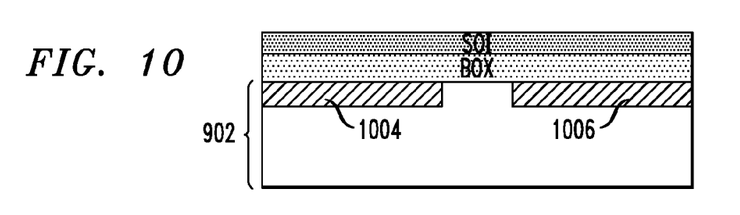

A portion(s) of substrate 902 is then doped to serve as the back gates of the device. FIG. 10 is a cross-sectional diagram illustrating two back gate areas having been formed in substrate 902, namely back gate 1004 and back gate 1006. According to an exemplary embodiment, selective doping is performed by first patterning a mask (e.g., photoresist) to block areas in which back gate formation is not intended. An implantation is then performed to put dopants below the BOX, thus forming the back gates.

As described above, different back gates need to be formed with different polarities (for example, back gates 104a and 104b of FIG. 1). The masking can be used to selectively implant dopants of different polarity (n-type dopants versus p-type dopants) and/or different dopant concentrations below the BOX in different back gate areas. By way of example only, in FIG. 10 two distinct back gate areas are shown having been formed in substrate 902 using the above-described process, a first back gate 1004 and a second back gate 1006. First back gate 1004 will have a different dopant polarity and/or concentration from second back gate 1006. It is notable that, alternatively, the back gates can be formed at the end of the process (using the same selective masking/implanting techniques presented above) after the deep/shallow isolation described below. While this particular alternative embodiment is not shown in the figures, it could be implemented by one of skill in the art given the present description.

The SOI layer will serve as a channel for the various transistors of the device. Accordingly, the SOI layer may have a wide variety of different suitable configurations (i.e., compositions, dimensions, etc.) which can vary depending on the particular application at hand. Given the present teachings, the particular configuration of the SOI layer suitable for a given application would be ascertainable by one of ordinary skill in the art.

Since the process involves shallow isolation and deep isolation in different regions of the device, the description that follows will reference various cross-sectional cuts through different parts of the device throughout the fabrication process. The orientation of the cuts with respect to the device structure are the same as those shown illustrated in FIG. 1 and FIG. 5. By way of example only, the cuts through line AA' of the device represent cuts through shallow isolation regions and the cuts through line DD' of the device represent cuts through a deep isolation region.

Figure 11:
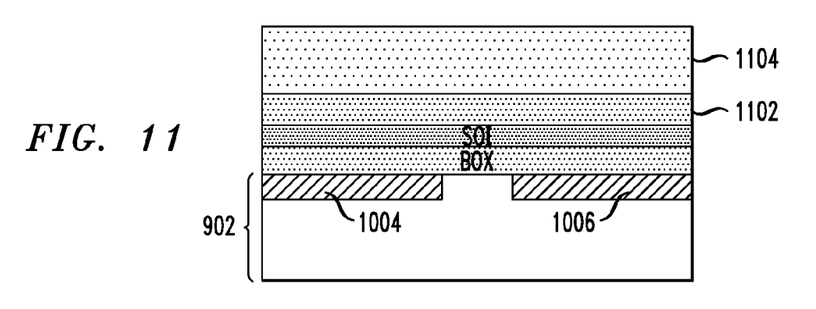

A mask is then formed over the wafer. According to an exemplary embodiment, the mask includes a hardmask layer and a photoresist layer. FIG. 11 is a cross-sectional diagram illustrating a hardmask layer 1102 having been deposited over the SOI layer and a photoresist layer 1104 having been deposited over hardmask layer 1102. Hardmask layer 1102 can include a bilayer of oxide and nitride (i.e., oxide deposited first and then nitride on top, or vice versa) and can be deposited over the SOI layer using, e.g., a chemical vapor deposition (CVD) process or thermal oxidation followed by nitride CVD. Photoresist layer 1104 can be deposited over hardmask layer 1102 using, e.g., spin coating.

Figure 12:
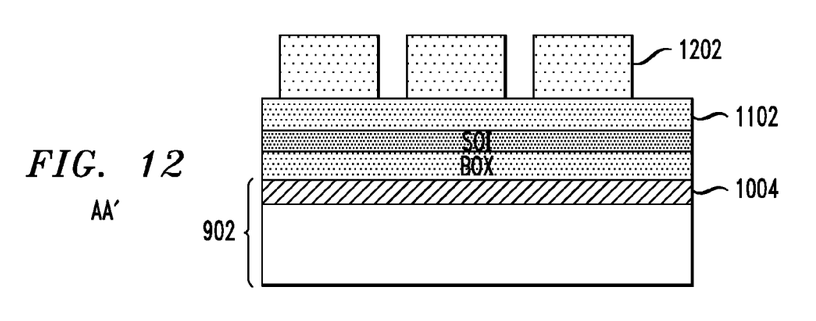
Figure 13:
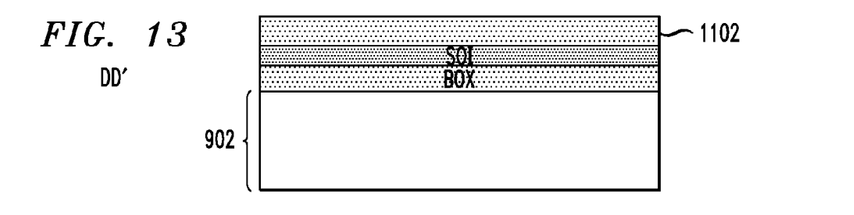

The photoresist is then patterned. FIGS. 12 and 13 are cross-sectional diagrams illustrating photoresist layer 1104 having been patterned into a plurality of segments 1202. Photoresist layer 1104 can be patterned using conventional lithography techniques. As shown in FIG. 12, a cross-sectional cut through line AA', i.e., through the shallow isolation regions of the device, photoresist layer 1104 is patterned into a plurality of segments 1202, each segment being present over what will be an active area of the device. By way of example only, when the process is being used to fabricate the device of FIG. 1, after patterning, photoresist segments 1202 remain over what will be each active area 102a and 102b. As described above, the transistors in a given active area share the same back gate. Therefore, the photoresist segments may be grouped based on their location over a particular back gate. For example, the photoresist segments present over what will be active areas 102a form one group, and the photoresist segments present over what will be active areas 102b form another group.

The photoresist layer is patterned such that the photoresist segments in each of the groups are spaced apart from one another in a first (e.g., vertical) direction. This spacing between the photoresist segments coincides with what will be the shallow isolation regions of the device. To obtain the device configuration shown in FIG. 1 wherein the active areas 102a/102b are aligned over back gate 104a/104b, respectively, the photoresist segments in each group can be aligned along the first (e.g., vertical) direction. Further, the groups are spaced apart from one another in a second (e.g., horizontal) direction. This spacing between the groups of photoresist segments coincides with what will be the deep isolation region of the device. Accordingly as shown in FIG. 13, a cross-sectional cut through line DD', i.e., through the deep isolation region of the device, only hardmask layer 1102 is present over these deep isolation regions (i.e., the photoresist layer has been removed from these regions).

Figure 14:
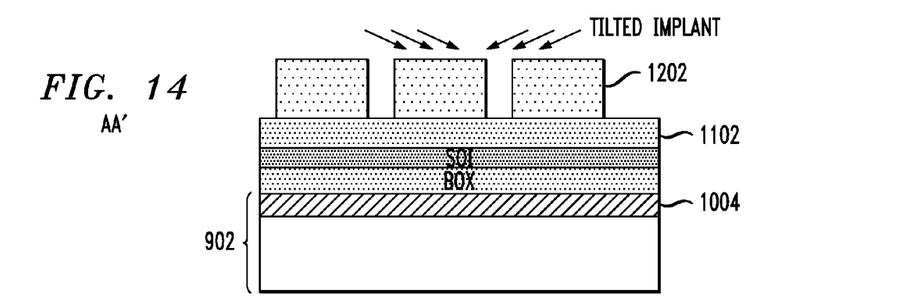
Figure 15:
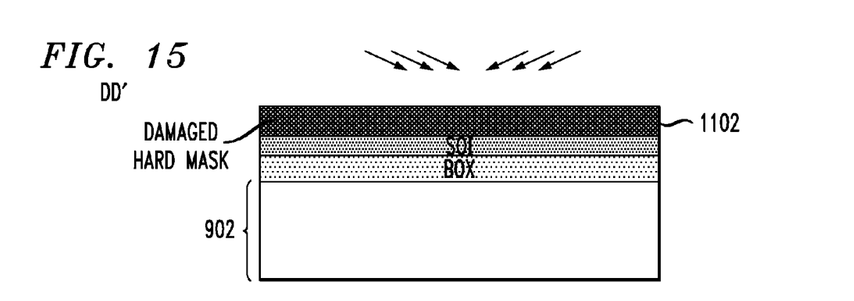

A tilted ion implantation is then performed to damage all but those portions of the hardmask layer covered or shadowed by the photoresist segments. FIGS. 14 and 15 are cross-sectional diagrams illustrating the tilted implant being used to damage hardmask layer 1102 wherever hardmask layer 1102 is not covered or shadowed by photoresist segments 1202. As highlighted above, the photoresist segments are present over what will be the active areas of the device. As shown in FIG. 14, a cross-sectional cut through line AA', i.e., through the shallow isolation regions of the device, the ion implant is performed along the first (e.g., vertical) direction (see above).

Accordingly, the area under each photoresist segment (covered) and the area between the photoresist segments in each group (shadowed) are protected from the implant. As shown in FIG. 15, a cross-sectional cut through line DD', i.e., through the deep isolation region of the device, the area between the groups of photoresist segments is not protected. As a result, hardmask layer 1102 is damaged in this area.

According to an exemplary embodiment, the implanted species includes one or more of argon (Ar) and xenon (Xe). The implant energy will depend on the thickness of the hardmask layer. According to an exemplary embodiment, the species are implanted at a dose of from about $1\times10^{15}$ per square centimeter ($cm^2$) to about $1\times10^{16}$ per $cm^2$.

Figure 16:
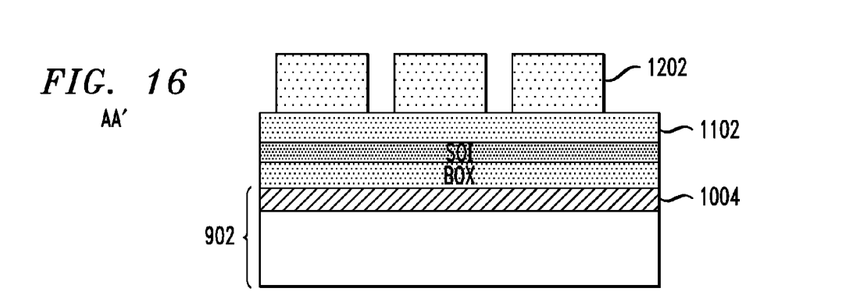
Figure 17:
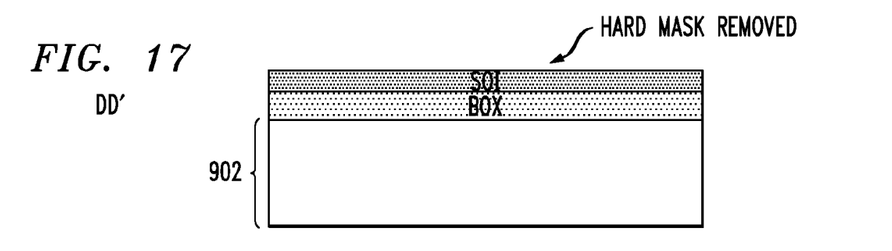

The device structure now contains undamaged hardmask over, and between, the active areas and damaged hardmask over the deep isolation region. The hardmask layer is then patterned by removing portions of the hardmask layer damaged by the implant (selective to the undamaged hardmask). FIGS. 16 and 17 are cross-sectional diagrams illustrating the damaged portions of hardmask layer 1102 having been removed. According to an exemplary embodiment, etching is used to remove the damaged portions of hardmask layer 1102. Any wet or dry etch that has selectivity between damaged or undamaged hardmask, e.g., wet etch using diluted hydrofluoric (HF) acid, can be used. As shown in FIG. 16, a cross-sectional cut through line AA', i.e., through the shallow isolation regions of the device, hardmask layer 1102 having been masked/shadowed by photoresist layer segments 1202 during the ion implantation is retained in its entirety in the shallow isolation regions. However, as shown in FIG. 17, a cross-sectional cut through line DD', i.e., through the deep isolation regions of the device, hardmask layer 1102 is removed entirely from the deep isolation regions.

Figure 18:
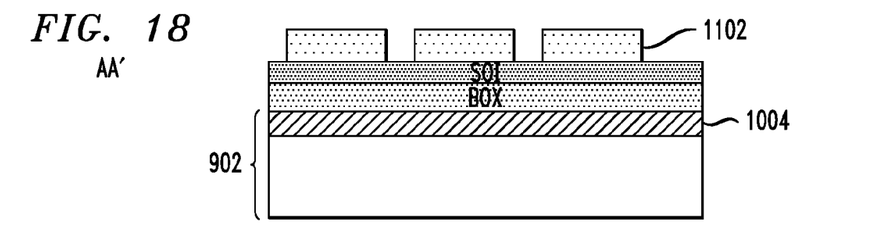
Figure 19:
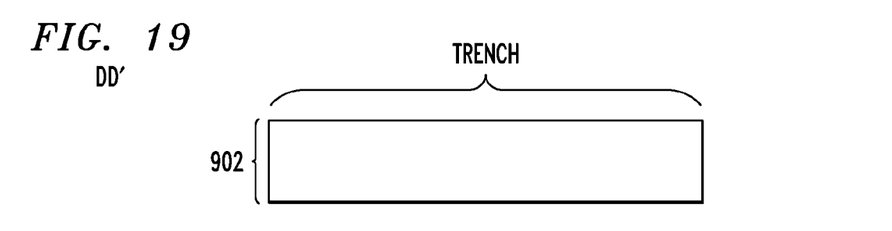

An etch (e.g., reactive ion etching (RIE)) is then performed through the patterned hardmask layer to form the deep isolation region. During this etch, the SOI layer, the BOX and at least the portion of the substrate in which the back gates are formed are removed in areas not covered by the hardmask layer, i.e., in the deep isolation region. FIGS. 18 and 19 are cross-sectional diagrams illustrating the SOI layer, the BOX, and a portion of the substrate in which the back gates are formed having been selectively removed from the deep isolation region. As shown in FIG. 18, a cross-sectional cut through line AA', i.e., through the shallow isolation regions of the device, the SOI layer and the BOX remain intact in this region after the etch. At this point in the process, the remaining hardmask (undamaged by the earlier implant) can then be patterned using the segments of photoresist that are still in place over the active areas. All of the photoresist can now be stripped using a conventional process (see FIG. 18 where it is shown that hardmask layer 1102 has been patterned over the active areas and the remaining photoresist has been removed). By contrast, as shown in FIG. 19, a cross-sectional cut through line DD', i.e., through the deep isolation region of the device, the SOI layer, the BOX and a portion of the substrate have been removed in this region by the etch, forming a trench. The trench is the deep isolation region of the device which has now been formed in the first (e.g., vertical) direction.

Figure 20:
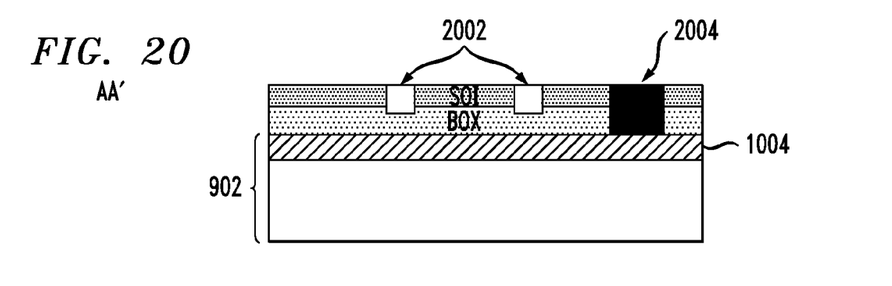
Figure 21:
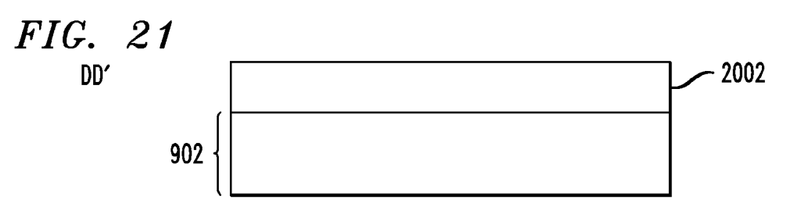

The shallow isolation regions of the device are then formed by etching the SOI layer through the hardmask layer that has now been patterned over the active areas. The portions of the SOI layer that remain after this shallow region etch are the active areas of the device. The shallow isolation regions formed in this manner will extend along a second (e.g., horizontal) direction that is perpendicular to the direction of the deep isolation region. The deep and shallow isolation regions can then be filled with a dielectric material, e.g., an oxide, using a conventional deposition process. A chemical mechanical polishing (CMP) is used at this point to planarize the filling dielectric so that the dielectric material is leveled to the top of the hardmask layer as known in the art. The remaining hardmask layer can then be removed. A wet etch process like hydrofluoric acid may also be used that selectively recesses the filling dielectric in the trenches so that the filling dielectric may be slightly elevated, flush or recessed compared to the SOI (as shown in FIG. 20). FIGS. 20 and 21 are cross-sectional diagrams illustrating the SOI layer having been selectively removed from the shallow isolation regions, the deep and shallow isolation regions having been filled with a dielectric material 2002 which is then planarized (the deep and shallow isolation regions are filled and planarized simultaneously) and the remaining hardmask layer having been removed. As shown in FIG. 20, a cross-sectional cut through line AA', i.e., through the shallow isolation regions of the device, the shallow etch stops in the BOX, since the active areas in this region share the same back gate, as described above. A dielectric material 2002 is then used to fill the shallow isolation regions and planed. At this point in the process, contacts to the back gates may now be formed. For example, as shown in FIG. 20, a contact 2004 to back gate 1004 is formed. Conventional processes can be employed to etch a via through the dielectric material, the SOI layer and the BOX and then fill the via with a conductive material (e.g., a metal). As shown in FIG. 21, a cross-sectional cut through line DD', i.e., through the deep isolation region of the device, dielectric material 2002 fills the deep isolation region. From this point forward the process of fabricating the device continues as with conventional techniques. As highlighted above, at least one transistor will be formed in each active area. In general, each transistor includes a source region and a drain region interconnected by a channel and a gate separated from the channel by a dielectric (a gate dielectric). By way of example only, back gate 1004 can serve as the gate and the BOX can serve as the gate dielectric. The source and drain regions as well as the channel can be formed in the SOI layer using conventional techniques (e.g., conventional doping can be used to form the source and drain regions). The same process applies for forming the transistors in the adjacent active areas that are across the deep isolation region.

Figure 22:
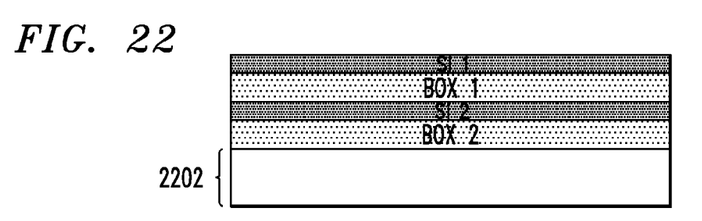
FIGS. 22-34 are diagrams illustrating an exemplary methodology for fabricating a double-BOX planar FDSOI device, such as the device of FIGS. 5-8, according to an embodiment of the present invention.

An exemplary single-mask process for fabricating the double-BOX planar FDSOI devices of FIGS. 5-8 will now be described with reference to FIGS. 22-34. FIG. 22 is a cross-sectional diagram illustrating a starting structure for the fabrication process. Namely, a double-BOX wafer is provided having a first semiconductor (e.g., silicon (Si)) layer "Si 1," a first BOX "BOX 1" beneath the first semiconductor layer, a second semiconductor (e.g., Si) layer "Si 2" under the first BOX, a second BOX "BOX 2" under the second semiconductor layer and a substrate 2202 (e.g., a Si substrate) under the second BOX. Besides Si, the second semiconductor layer could include a metal, another semiconductor like silicon germanium (SiGe), germanium (Ge), or group III-V elements or other compound semiconductors. The first BOX and the second BOX are preferably thin, i.e., each BOX having a thickness of from about 2 nm to about 50 nm so as to get a large body factor. It is notable that the second semiconductor layer will be used to form a backgate of the device and can be a single crystal Si, polysilicon, or amorphous Si layer that is converted to polysilicon during the fabrication process (e.g., the amorphous Si can be converted to polysilicon during the heat cycle of several of the front-end-of-line (FEOL) processes like source-drain anneal and the like).

Figure 23:
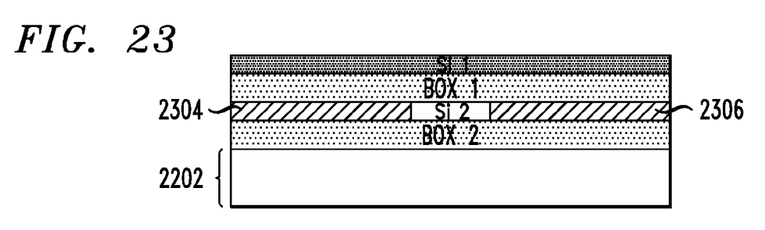

A portion(s) of the second semiconductor layer in the wafer is then doped to serve as the back gates of the device. FIG. 23 is a cross-sectional diagram illustrating two back gate areas having been formed in the second semiconductor layer, namely back gate 2304 and back gate 2306. According to an exemplary embodiment, selective doping is performed by first patterning a mask (e.g., photoresist) to block areas in which back gate formation is not intended. An implantation is then performed to put dopants below the first BOX, thus forming the back gates.

As described above, different back gates need to be formed with different polarities (for example, back gates 504a and 504b of FIG. 5). The masking can be used to selectively implant dopants of different polarity (n-type dopants versus p-type dopants) and/or different dopant concentrations below the first BOX in different back gate areas. By way of example only, in FIG. 23 two distinct back gate areas are shown having been formed in the second semiconductor layer using the above-described process, a first back gate 2304 and a second back gate 2306. First back gate 2304 will have a different dopant polarity and/or concentration from second back gate 2306. It is notable that, alternatively, the back gates can be formed at the end of the process (using the same selective masking/implanting techniques presented above) after the deep/shallow isolation described below. While this particular alternative embodiment is not shown in the figures, it could be implemented by one of skill in the art given the present description.

The first semiconductor layer will serve as a channel for the various transistors of the device. Accordingly, the first semiconductor layer may have a wide variety of different suitable configurations (i.e., compositions, dimensions, etc.) which can vary depending on the particular application at hand. Given the present teachings, the particular configuration of the first semiconductor layer suitable for a given application would be ascertainable by one of ordinary skill in the art.

Since the process involves shallow isolation and deep isolation in different regions of the device, the description that follows will reference various cross-sectional cuts through different parts of the device throughout the fabrication process. The orientation of the cuts with respect to the device structure are the same as those shown illustrated in FIG. 1 and FIG. 5. By way of example only, the cuts through line AA' of the device represent cuts through shallow isolation regions and the cuts through line DD' of the device represent cuts through a deep isolation region.

Figure 24:
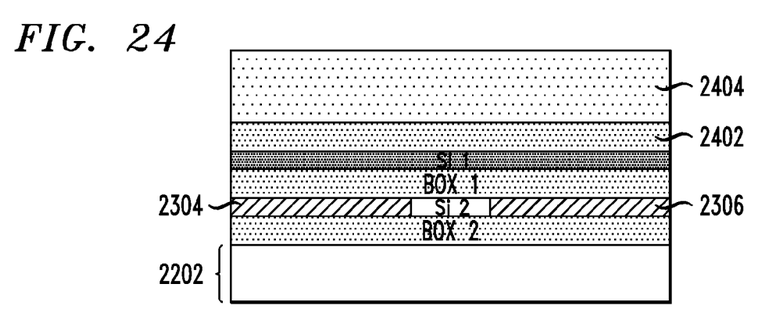

A mask is then formed over the wafer. According to an exemplary embodiment, the mask includes a hardmask layer and a photoresist layer. FIG. 24 is a cross-sectional diagram illustrating a hardmask layer 2402 having been deposited over the first semiconductor layer and a photoresist layer 2404 having been deposited over hardmask layer 2402. As described above, hardmask layer 2402 can include a bilayer of oxide and nitride (i.e., oxide deposited first and then nitride on top, or vice versa) and can be deposited over the first semiconductor layer using, e.g., a CVD process or thermal oxidation followed by nitride CVD. Accordingly, photoresist layer 2404 can be deposited over hardmask layer 2402 using, e.g., spin coating.

Figure 25:
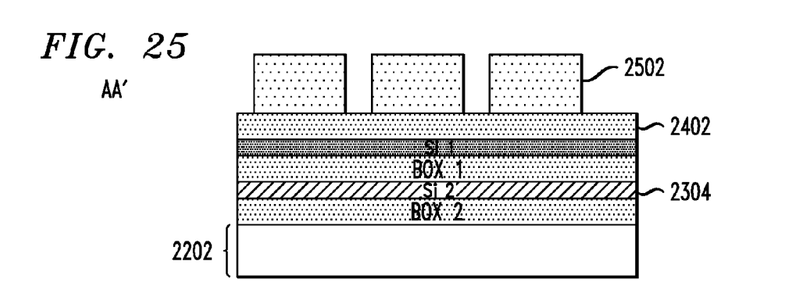
Figure 26:
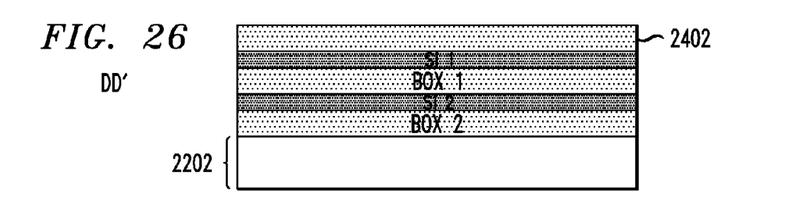

The photoresist is then patterned. FIGS. 25 and 26 are cross-sectional diagrams illustrating photoresist layer 2404 having been patterned into a plurality of segments 2502. Photoresist layer 2404 can be patterned using conventional lithography techniques. As shown in FIG. 25, a cross-sectional cut through line AA', i.e., through the shallow isolation regions of the device, photoresist layer 2404 is patterned into a plurality of segments 2502, each segment being present over what will be an active area of the device. By way of example only, when the process is being used to fabricate the device of FIG. 5, after patterning, photoresist segments 2502 remain over what will be each active area 502a and 502b. As described above, the transistors in a given active area share the same back gate. Therefore, the photoresist segments may be grouped based on their location over a particular back gate. For example, the photoresist segments present over what will be active areas 502a form one group, and the photoresist segments present over what will be active areas 502b form another group.

The photoresist layer is patterned such that the photoresist segments in each of the groups are spaced apart from one another in a first (e.g., vertical) direction. This spacing between the photoresist segments coincides with what will be the shallow isolation regions of the device. To obtain the device configuration shown in FIG. 5 wherein the active areas 502a/502b are aligned over back gate 504a/504b, respectively, the photoresist segments in each group can be aligned along the first (e.g., vertical) direction. Further, the groups are spaced apart from one another in a second (e.g., horizontal) direction. This spacing between the groups of photoresist segments coincides with what will be the deep isolation region of the device. Accordingly as shown in FIG. 26, a cross-sectional cut through line DD', i.e., through the deep isolation region of the device, only hardmask layer 2402 is present over these deep isolation regions (i.e., the photoresist layer has been removed from these regions).

Figure 27:
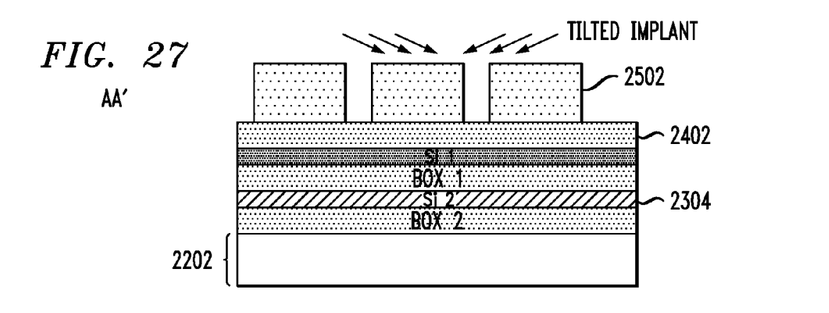
Figure 28:
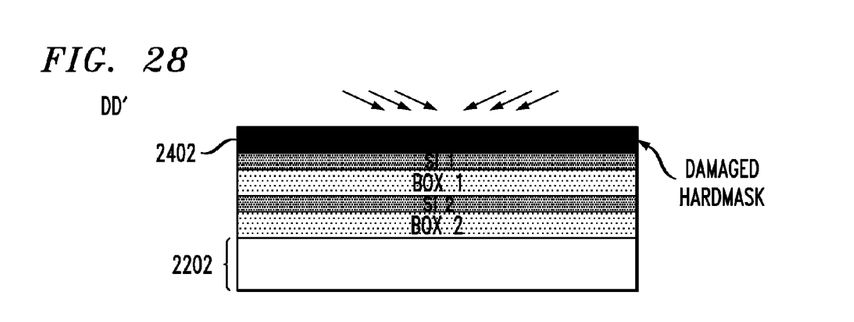

A tilted ion implantation is then performed to damage all but those portions of the hardmask layer covered or shadowed by the photoresist segments. FIGS. 27 and 28 are cross-sectional diagrams illustrating the tilted implant being used to damage hardmask layer 2402 wherever hardmask layer 2402 is not covered or shadowed by photoresist segments 2502. As highlighted above, the photoresist segments are present over what will be the active areas of the device. As shown in FIG. 27, a cross-sectional cut through line AA', i.e., through the shallow isolation regions of the device, the ion implant is performed along the first (e.g., vertical) direction (see above). Accordingly, the area under each photoresist segment (covered) and the area between the photoresist segments in each group (shadowed) are protected from the implant. As shown in FIG. 28, a cross-sectional cut through line DD', i.e., through the deep isolation region of the device, the area between the groups of photoresist segments is not protected. As a result, hardmask layer 2402 is damaged in this area.

Figure 29:
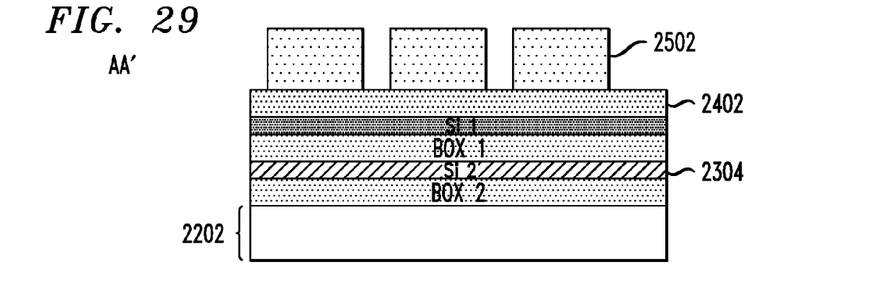
Figure 30:
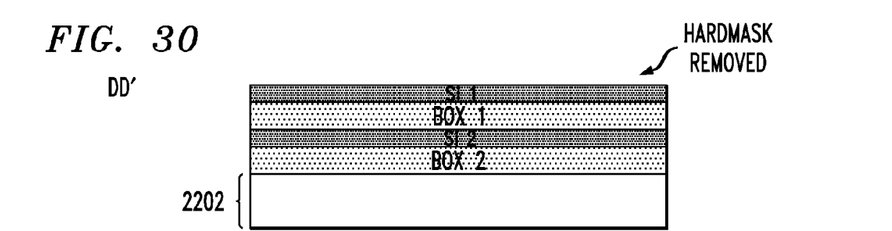

The device structure now contains undamaged hardmask over, and between, the active areas and damaged hardmask over the deep isolation region. The hardmask layer is then patterned by removing portions of the hardmask layer damaged by the implant (selective to the undamaged hardmask). FIGS. 29 and 30 are cross-sectional diagrams illustrating the damaged portions of hardmask layer 2402 having been removed. According to an exemplary embodiment, etching is used to remove the damaged portions of hardmask layer 2402. Any wet or dry etch that has selectivity between damaged or undamaged hardmask, e.g., wet etch using diluted hydrofluoric (HF) acid, can be used. As shown in FIG. 29, a cross-sectional cut through line AA', i.e., through the shallow isolation regions of the device, hardmask layer 2402 having been masked/shadowed by photoresist layer segments 2502 during the ion implantation is retained in its entirety in the shallow isolation regions. However, as shown in FIG. 30, a cross-sectional cut through line DD', i.e., through the deep isolation regions of the device, hardmask layer 2402 is removed entirely from the deep isolation regions.

Figure 31:
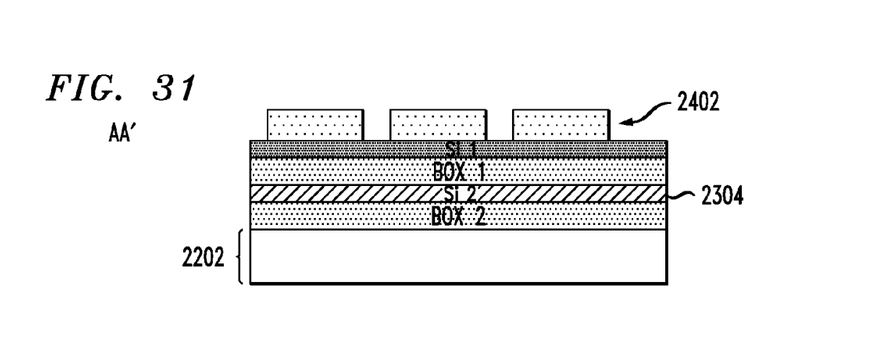
Figure 32:
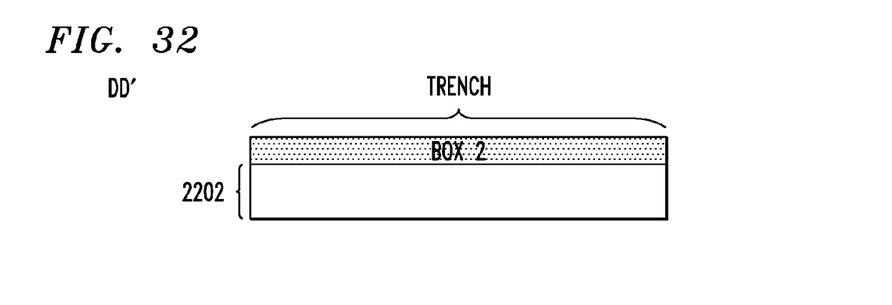

An etch (e.g., reactive ion etching (RIE)) is then performed through the patterned hardmask layer to form the deep isolation region. During this etch, the first semiconductor layer, the first BOX and the second semiconductor layer are all removed in areas not covered by the hardmask layer, i.e., in the deep isolation region. FIGS. 31 and 32 are cross-sectional diagrams illustrating the first/second semiconductor layer and the first BOX having been selectively removed from the deep isolation region. As shown in FIG. 31, a cross-sectional cut through line AA', i.e., through the shallow isolation regions of the device, both of the semiconductor layers and the BOX layers remain intact in this region after the etch. At this point in the process, the remaining hardmask (undamaged by the earlier implant) can then be patterned using the segments of photoresist that are still in place over the active areas (see FIG. 31 where it is shown that hardmask layer 2402 has been patterned over the active areas). All of the photoresist can now be stripped using a conventional process. By contrast, as shown in FIG. 32, a cross-sectional cut through line DD', i.e., through the deep isolation region of the device, the first and second semiconductor layers and the first BOX have been removed in this region by the etch, forming a trench. The trench is the deep isolation region of the device which has now been formed in the first (e.g., vertical) direction.

Figure 33:
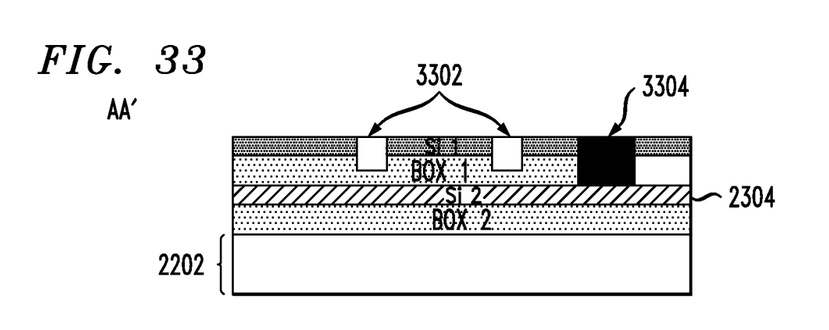
Figure 34:
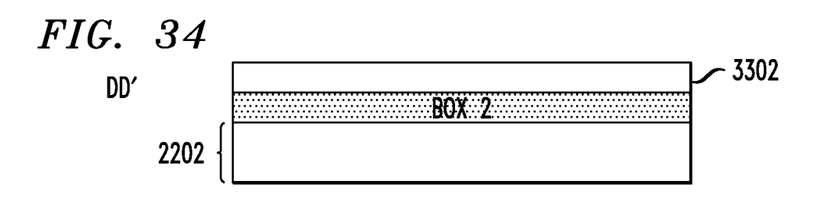

The shallow isolation regions of the device are then formed by etching the first semiconductor layer through the hardmask layer that has now been patterned over the active areas. The portions of the first semiconductor layer that remain after this shallow region etch are the active areas of the device. The shallow isolation regions formed in this manner will extend along a second (e.g., horizontal) direction that is perpendicular to the direction of the deep isolation region. The deep and shallow isolation regions can then be filled with a dielectric material using a conventional deposition process. A CMP is used at this point to planarize the filling dielectric so that the dielectric material is leveled to the top of the hardmask layer as known in the art. The remaining hardmask layer can then be removed. A wet etch process like hydrofluoric acid may also be used that selectively recesses the filling dielectric in the trenches so that the filling dielectric may be slightly elevated, flush or recessed compared to the first semiconductor layer (as shown in FIG. 33). FIGS. 33 and 34 are cross-sectional diagrams illustrating the first semiconductor layer having been selectively removed from the shallow isolation regions, the deep and shallow isolation regions having been filled with a dielectric 3302 which is then planarized (the deep and shallow isolation regions are filled and planarized simultaneously) and the remaining hardmask layer having been removed. As shown in FIG. 33, a cross-sectional cut through line AA', i.e., through the shallow isolation regions of the device, the shallow etch stops in the first BOX, since the active areas in this region share the same back gate, as described above. A dielectric material 3302 is then used to fill the shallow isolation regions and planed. At this point in the process, contacts to the back gates may now be formed. For example, as shown in FIG. 33, a contact 3304 to back gate 2304 is formed. Conventional processes can be employed to etch a via through the dielectric material, the first semiconductor layer and the first BOX and then fill the via with a conductive material (e.g., a metal). As shown in FIG. 34, a cross-sectional cut through line DD', i.e., through the deep isolation region of the device, dielectric material 3302 fills the deep isolation region. From this point forward the process of fabricating the device continues as with conventional techniques. As highlighted above, at least one transistor will be formed in each active area. In general, each transistor includes a source region and a drain region interconnected by a channel and a gate separated from the channel by a dielectric (a gate dielectric). By way of example only, back gate 2304 can serve as the gate and the first BOX can serve as the gate dielectric. The source and drain regions as well as the channel can be formed in the first semiconductor layer using conventional techniques (e.g., conventional doping can be used to form the source and drain regions). The same process applies for forming the transistors in the adjacent active areas that are across the deep isolation region.

As a result of the above-described processes a single mask is used to define the shallow and deep isolation regions of the (single- or double-) BOX device. Namely, the single mask is used to define both the active areas and the back gates of the devices. As a result, the back gates are aligned with the active areas. By comparison, with conventional processes the active areas are typically misaligned with the back gates which can undesirably lead to variation in device performance and in extreme cases device malfunction.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A device, comprising:
   a deep isolation region formed in a wafer along a first direction and shallow isolation regions self-aligned to the deep isolation region formed in the wafer along a second direction, wherein the first direction and the second direction are perpendicular to one another;
   a dielectric material filling the deep isolation region and the shallow isolation regions;
   multiple first active areas aligned along the first direction and spaced apart from one another in the first direction by the shallow isolation regions;
   multiple second active areas aligned along the first direction and spaced apart from one another in the first direction by the shallow isolation regions; and
   transistors formed in the first active areas and in the second active areas, wherein the transistors formed in the first active areas share a same first back gate and the transistors formed in the second active areas share a same second back gate, wherein the first back gate and the second back gate are spaced apart from one another in the second direction by the deep isolation region, and wherein by way of the shallow isolation regions, which define the first active areas and the second active areas, being self-aligned to the deep isolation region, which defines the first back gate and the second back gate, the first back gate is present only in, and thus is self-aligned with, the first active areas, and the second back gate is present only in, and thus is self-aligned with, the second active areas.

2. The device of claim 1, wherein the wafer comprises a substrate, a BOX over the substrate and a SOI layer over the BOX.

3. The device of claim 2, wherein the deep isolation region comprises a deep trench in the SOI layer, the BOX and at least a portion of the substrate.

4. The device of claim 2, wherein the shallow isolation regions comprise shallow trenches in the SOI layer.

5. The device of claim 2, wherein portions of the substrate are doped to form the first back gate and the second back gate of the device.

6. The device of claim 1, wherein the wafer comprises a first semiconductor layer, a first BOX under the first semiconductor layer, a second semiconductor layer under the first BOX, a second BOX under the second semiconductor layer and a substrate under the second BOX.

7. The device of claim 6, wherein the deep isolation region comprises a deep trench in the first semiconductor layer, the first BOX and the second semiconductor layer.

8. The device of claim 6, wherein the shallow isolation regions comprise shallow trenches in the first semiconductor layer.

9. The device of claim 6, wherein portions of the second semiconductor layer are doped to form the first back gate and the second back gate of the device.

* * * * *